(12) United States Patent
Cho et al.

(10) Patent No.: US 10,147,944 B2
(45) Date of Patent: Dec. 4, 2018

(54) CATHODE INCLUDING SINTERED POLYCRYSTALLINE MATERIAL, SECONDARY BATTERY INCLUDING THE CATHODE, AND METHOD OF MANUFACTURING THE CATHODE

(71) Applicant: SAMSUNG ELECTRONICS CO., LTD., Suwon-si, Gyeonggi-do (KR)

(72) Inventors: Kyunghoon Cho, Suwon-si (KR); Seunghoon Nam, Seoul (KR); Hwiyeol Park, Ansan-si (KR); Hojung Yang, Suwon-si (KR); Huisu Jeong, Hwaseong-si (KR); Jin S. Heo, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 352 days.

(21) Appl. No.: 15/047,740

(22) Filed: Feb. 19, 2016

(65) Prior Publication Data

US 2017/0040607 A1    Feb. 9, 2017

(30) Foreign Application Priority Data

Aug. 4, 2015  (KR) .......................... 10 2015 0110232

(51) Int. Cl.
*H01M 4/525* (2010.01)
*H01M 4/131* (2010.01)
(Continued)

(52) U.S. Cl.
CPC ............. *H01M 4/525* (2013.01); *C30B 28/02* (2013.01); *C30B 29/22* (2013.01);
(Continued)

(58) Field of Classification Search
CPC ...................................................... H01M 4/00
See application file for complete search history.

(56) References Cited

U.S. PATENT DOCUMENTS

| 4,668,595 A | 5/1987 | Yoshino et al. |
| 5,609,975 A | 3/1997 | Hasegawa et al. |
| 2010/0279176 A1* | 11/2010 | Ogawa .................. H01M 4/131 429/304 |

FOREIGN PATENT DOCUMENTS

| EP | 2447214 A2 | 5/2012 |
| EP | 2706598 A1 | 3/2014 |

(Continued)

OTHER PUBLICATIONS

H. Yamada, et al.; Anistropy in Activation Energy of Textured LiCoO2 for the Initial Stage of Sintering; SciVerse ScienceDirect, Journal of the European Ceramic Society vol. 33, pp. 1037-1044; 2013.
Hui Xia, et al.; Texture Effect on the Electrochemical Properties of LiCoO2 Thin Films Prepared by PLD; Science Direct, Electrochimica Acta vol. 52; pp. 7014-7021; May 18, 2007.
J.B. Bates, et al.; Preferred Orientation of Polycrystalline LiCoO2 Films; Journal of Electrochem. Soc. vol. 147, Issue 1, pp. 59-70, 2000.

(Continued)

*Primary Examiner* — James Lee
(74) *Attorney, Agent, or Firm* — Cantor Colburn LLP

(57) ABSTRACT

A cathode includes a cathode collector layer, and a cathode active material layer on a surface of the cathode collector layer. The cathode active material layer includes a sintered polycrystalline material having a plurality of crystal grains of a lithium-based oxide, and each of the plurality of crystal grains includes a seed template, and a matrix crystal around the seed template, where the seed template is a single crystal and having a shape of a plate.

10 Claims, 15 Drawing Sheets

(51) Int. Cl.

| | |
|---|---|
| *H01M 4/04* | (2006.01) |
| *H01M 4/1391* | (2010.01) |
| *H01M 4/505* | (2010.01) |
| *C30B 28/02* | (2006.01) |
| *C30B 29/22* | (2006.01) |
| *H01M 4/134* | (2010.01) |
| *H01M 4/1395* | (2010.01) |
| *H01M 4/38* | (2006.01) |
| *H01M 10/0525* | (2010.01) |
| *H01M 10/0562* | (2010.01) |
| *H01M 10/052* | (2010.01) |
| *H01M 10/0583* | (2010.01) |
| *H01M 4/02* | (2006.01) |

(52) U.S. Cl.
CPC ....... *H01M 4/0404* (2013.01); *H01M 4/0407* (2013.01); *H01M 4/0471* (2013.01); *H01M 4/131* (2013.01); *H01M 4/134* (2013.01); *H01M 4/1391* (2013.01); *H01M 4/1395* (2013.01); *H01M 4/382* (2013.01); *H01M 4/505* (2013.01); *H01M 10/0525* (2013.01); *H01M 10/0562* (2013.01); *H01M 10/052* (2013.01); *H01M 10/0583* (2013.01); *H01M 2004/021* (2013.01); *H01M 2004/027* (2013.01); *H01M 2004/028* (2013.01); *H01M 2220/30* (2013.01); *H01M 2300/0068* (2013.01)

(56) References Cited

FOREIGN PATENT DOCUMENTS

| | | |
|---|---|---|
| JP | H08180904 A | 7/1996 |
| JP | 2003132887 A | 5/2003 |
| JP | 2009295514 A | 12/2009 |
| JP | 2010218819 A | 9/2010 |
| JP | 2011065787 A | 3/2011 |
| JP | 2012009194 A | 1/2012 |
| JP | 2014049407 A | 3/2014 |
| JP | 5542694 B2 | 7/2014 |
| KR | 1020040106207 A | 12/2004 |
| KR | 1020100057678 A | 5/2010 |

OTHER PUBLICATIONS

J.F. Whitacre, et al.; Crystallographically Oriented Thin-Film Nanocrystalline Cathode Layers Prepared Without Exceeding 300° C.; Journal of Electrochem. Soc., vol. 148, Issue 10, pp. A1078-A1084; 2001.

Search Report for KR Application No. 10-2015-0110232, Filing Date Aug. 4, 2015; Report Dated Apr. 7, 2015; 12 pages.

Yasuhiko Takahashi, et al.; Rapid Communication Anisotropic Electrical Conductivity in LiCoO2 Single Crystal; Journal of Solid State Chemistry vol. 164, pp. 1-4; 2002.

Extended European Search Report for Application No. 16158365.3 dated Oct. 21, 2016.

\* cited by examiner

CATHODE INCLUDING SINTERED POLYCRYSTALLINE MATERIAL, SECONDARY BATTERY INCLUDING THE CATHODE, AND METHOD OF MANUFACTURING THE CATHODE

CROSS-REFERENCE TO RELATED APPLICATION

This application claims priority to Korean Patent Application No. 10-2015-0110232, filed on Aug. 4, 2015, and all the benefits accruing therefrom under 35 U.S.C. § 119, the content of which in its entirety is herein incorporated by reference.

BACKGROUND

1. Field

The disclosure relates to a cathode including a sintered polycrystalline material in which a crystal direction is set to facilitate movement of electrons, a secondary battery including the cathode, and a method of manufacturing the cathode.

2. Description of the Related Art

As the electronics technologies have developed, the markets for various mobile electronic devices such as mobile phones, game devices, smartphones, smart pads, electronic-book terminals, tablet computers, or mobile medical devices worn on the human body have grown considerably. Accordingly, with the increase in the mobile electronic devices related market, a demand for batteries appropriate for driving mobile electronic devices has increased.

Unlike primary batteries, secondary batteries are rechargeable. In recent, demand for lithium batteries has increased because lithium batteries have a higher voltage and higher energy density per unit weight than nickel-cadmium batteries or nickel-hydrogen batteries. Lithium batteries are typically classified into liquid electrolyte batteries and solid polymer electrolyte batteries according to the type of the electrolyte used. A battery using a liquid electrolyte is referred to as a lithium ion battery and a battery using a solid polymer electrolyte is referred to as a lithium polymer battery. In lithium batteries, a lithium based oxide is mainly used as a cathode active material and a carbon material is mainly used as an anode active material. In general, a mixture of an active material particle, a conductive material, and a binder is mainly used as the cathode active material.

SUMMARY

Additional aspects will be set forth in part in the description which follows and, in part, will be apparent from the description, or may be learned by practice of the presented exemplary embodiments.

According to an exemplary embodiment, a cathode includes a cathode collector layer, and a cathode active material layer on a surface of the cathode collector layer, in which the cathode active material layer includes a sintered polycrystalline material having a plurality of crystal grains of a lithium-based oxide, and each of the plurality of crystal grains includes a seed template and a matrix crystal around the seed template, where the seed template is a single crystal and having a shape of a plate.

In an exemplary embodiment, a surface of the seed template having the shape of the plate, which faces a surface of the cathode collector layer, may be substantially parallel to the surface of the cathode collector layer.

In an exemplary embodiment, an acute angle between a surface of the seed template having the shape of the plate, which faces a surface of the cathode collector layer, and a surface of the cathode collector layer may be in a range of about ±45°.

In an exemplary embodiment, the seed template and the matrix crystal may have different compositions from each other.

In an exemplary embodiment, the plurality of crystal grains may be oriented such that an acute angle between a direction perpendicular to a surface of the cathode collector layer and a direction of lithium planes defined by lithium elements in layers in each of the plurality of crystal grains is within a range of about ±45°.

In an exemplary embodiment, some of the plurality of crystal grains may be oriented in a way such that a lithium plane defined by lithium elements in layers in each of the plurality of crystal grains is substantially perpendicular to a surface of the cathode collector layer.

In an exemplary embodiment, a crystal direction of the plurality of crystal grains perpendicular to a surface of the cathode collector layer may include at least one of directions <h00>, <0k0>, <hk0>, <101>, <012>, <104>, <113>, <021>, and <024>, in which "h" and "k" are integers equal to or greater than 1.

In an exemplary embodiment, the lithium-based oxide may include $Li_xMO_2$, wherein "M" may be at least one of cobalt (Co), nickel (Ni), manganese (Mn) and "x" is in a range that $0.2<x<1.2$.

In an exemplary embodiment, the cathode active material layer may directly contact the cathode collector layer.

According to another exemplary embodiment, a cathode includes a cathode collector layer, a plurality of cathode active material layers electrically contacting the cathode collector layer and perpendicular to the cathode collector layer, and a conductive layer electrically contacting the cathode collector layer and disposed in the plurality of cathode active material layers, in which each of the plurality of cathode active material layers may include a sintered polycrystalline material having a plurality of crystal grains formed of a lithium-based oxide, and each of the plurality of crystal grains may include a seed template and a matrix crystal around the seed template, the seed template being a single crystal and having a shape of a plate.

In an exemplary embodiment, a surface of the seed template having a shape of a plate facing a surface of the conductive layer may be parallel to the surface of the conductive layer.

In an exemplary embodiment, an acute angle between a surface of the seed template having a shape of a plate facing a surface of the conductive layer and the surface of the conducive layer may be within a range of about ±45°.

In an exemplary embodiment, a crystal direction of the plurality of crystal grains perpendicular to a surface of the conductive layer may include at least one of directions <h00>, <0k0>, <hk0>, <101>, <012>, <104>, <113>, <021>, and <024>, in which "h" and "k" are integers equal to or greater than 1.

In an exemplary embodiment, the plurality of crystal grains may be oriented such that an acute angle between a direction perpendicular to a surface of the conductive layer and a direction of lithium planes formed of lithium elements disposed in layers in each of the plurality of crystal grains is within a range of about ±45°.

According to another exemplary embodiment, a secondary battery includes an anode collector layer, an anode active material layer on a surface of the anode collector layer, a cathode collector layer; and a cathode active material layer on a surface of the cathode collector layer, in which the cathode active material layer includes a sintered polycrystalline material having a plurality of crystal grains formed of a lithium-based oxide, and each of the plurality of crystal grains includes a seed template and a matrix crystal around the seed template, the seed template being a single crystal and having a shape of a plate.

According to another exemplary embodiment, a secondary battery includes a cathode collector layer and an anode collector layer that face each other, a plurality of cathode active material layers electrically contacting the cathode collector layer and perpendicular to the cathode collector layer, a plurality of anode active material layers electrically contacting the anode collector layer and perpendicular to the anode collector layer, an electrolyte layer formed in a zigzag shape between the plurality of cathode active material layers and the plurality of anode active material layers, and a first conductive layer electrically contacting the cathode collector layer and disposed in the plurality of cathode active material layers, in which each of the plurality of cathode active material layers includes a sintered polycrystalline material having a plurality of crystal grains formed of a lithium-based oxide, and each of the plurality of crystal grains includes a seed template and a matrix crystal around the seed template, the seed template being a single crystal and having a shape of a plate.

In an exemplary embodiment, the zigzag shape of the electrolyte layer may be disposed between the plurality of cathode active material layers and the plurality of anode active material layer, between the plurality of cathode active material layers and the anode collector layer, and between the plurality of anode active material layer and the cathode collector layer.

In an exemplary embodiment, the secondary battery may further include a second conducive layer electrically contacting the anode collector layer and disposed in the plurality of anode active material layer.

According to another exemplary embodiment, a secondary battery includes a cathode collector layer, an anode collector layer which face the cathode collector, a plurality of cathode active material layers electrically contacting the cathode collector layer and perpendicular to the cathode collector layer, an electrolyte layer in a zigzag shape along surfaces of the plurality of cathode active material layers and a surface of the cathode collector layer and having a first surface contacting the plurality of cathode active material layers and the cathode collector layer and a second surface at a side opposite the first surface, a plurality of anode active material layers electrically contacting the anode collector layer and perpendicular to the anode collector layer along the second surface of the electrolyte layer, and a first conductive layer electrically contacting the cathode collector layer and disposed in the plurality of cathode active material layers. In such an embodiment, each of the plurality of cathode active material layers includes a sintered polycrystalline material having a plurality of crystal grains of a lithium-based oxide, and each of the plurality of crystal grains includes a seed template and a matrix crystal around the seed template, in which the seed template is a single crystal and having a shape of a plate.

In an exemplary embodiment, the anode active material layer may be in a zigzag shape along the second surface of the electrolyte layer in the zigzag shape.

In an exemplary embodiment, the anode active material layer may be disposed in a valley defined by the second surface of the electrolyte layer in the zigzag shape.

According to another exemplary embodiment, a method of manufacturing a cathode includes forming an active material slurry by mixing a powder of a cathode active material including a lithium-based oxide, a binder and a solvent, mixing a plurality of seed templates, which are single crystals and have a shape of a plate, in the active material slurry, forming an active material tape by casting and drying the active material slurry in a form of a thick film tape, forming a cathode collector on a surface of the active material tape, which is dried, and forming a cathode active material layer having a plurality of crystal grains by sintering the active material tape, in which the seed templates are aligned in a way such that an acute angle between a surface of each of the plurality of seed templates mixed in the dried active material tape and a surface of the cathode active material layer is in a range of about ±45°.

In an exemplary embodiment, the forming of the active material tape may include coating the active material slurry on a carrier film to a uniform thickness via a tape casting method by discharging the active material slurry over the carrier film through an opening of a dam, in which the opening has a width greater than a height thereof, and heating the active material slurry coated on the carrier film, and in which the plurality of seed templates, which are single crystals mixed in the active material slurry, are naturally aligned in a direction in which the active material slurry is discharged due to a shear force acting on the opening of the dam through which the active material slurry is discharged.

BRIEF DESCRIPTION OF THE DRAWINGS

These and/or other features will become apparent and more readily appreciated from the following description of the exemplary embodiments, taken in conjunction with the accompanying drawings, in which.

DETAILED DESCRIPTION

Figure 1:
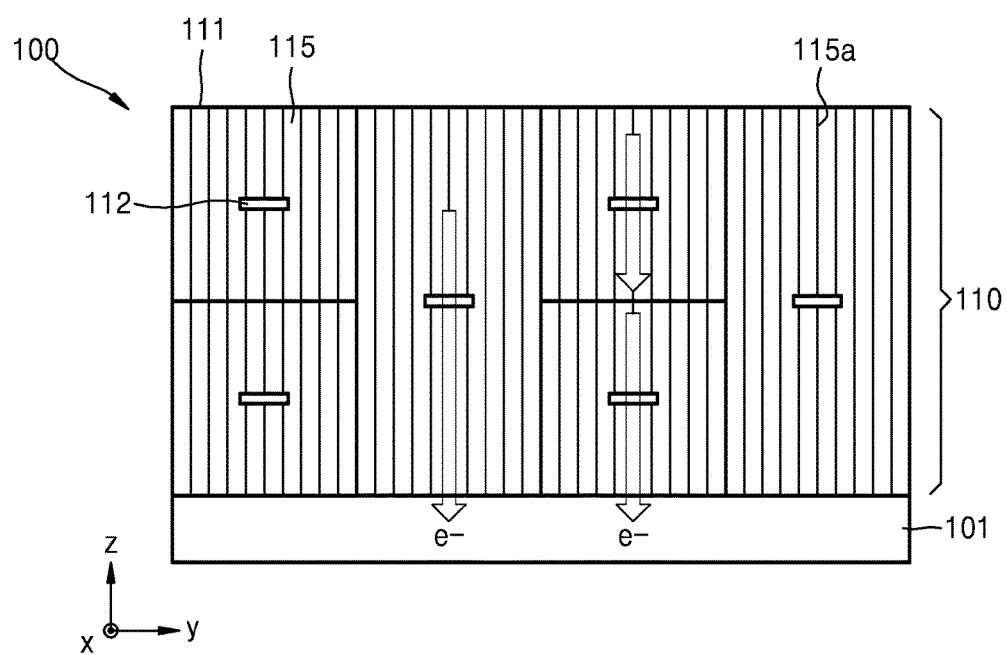
FIG. 1 is a schematic cross-sectional view of a structure of a cathode of a secondary battery according to an exemplary embodiment.

Reference will now be made in detail to a cathode including a sintered polycrystalline material, a secondary battery including the cathode, and a method of manufacturing the cathode, examples of which are illustrated in the accompanying drawings, in which like reference numerals refer to like elements throughout. Also, the size of each layer illustrated in the drawings may be exaggerated for convenience of explanation and clarity. In this regard, the embodiments may have different forms and should not be construed as being limited to the descriptions set forth herein. Accordingly, the embodiments are merely described below, by referring to the figures, to explain aspects of the description.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, exemplary embodiments of the invention will be described in detail with reference to the accompanying drawings.

FIG. 1 is a schematic cross-sectional view of a structure of a cathode 100 of a secondary battery according to an exemplary embodiment. Referring to FIG. 1, an exemplary embodiment of the cathode 100 may include a cathode collector layer 101 and a cathode active material layer 110 disposed on a surface of the cathode collector layer 101. The cathode collector layer 101 may include or be formed of a conductive metal material, for example, Cu, Au, Pt, Ag, Zn, Al, Mg, Ti, Fe, Co, Ni, Ge, In, or Pd. In an exemplary embodiment, as illustrated in FIG. 1, the cathode collector layer 101 may have a shape of a thin and flat plate.

The cathode active material layer 110 may be arranged on a flat surface, e.g., an upper surface, of the cathode collector layer 101. Accordingly, the cathode active material layer 110 may directly contact the cathode collector layer 101. The cathode active material layer 110 may include or be formed of a material including, for example, a lithium-based oxide including a cathode composition, e.g., $LiCoO_2$. In such an embodiment, various lithium-based oxide materials other than $LiCoO_2$ may be used. In one exemplary embodiment, for example, a lithium-based oxide may include $Li_xMO_2$, where "M" may include at least one of cobalt (Co), nickel (Ni), and manganese (Mn) and "x" may be within a range that $0.2<x<1.2$.

In such an embodiment, the cathode active material layer 110 may include or be formed of sintered polycrystalline ceramics obtained by sintering a cathode active material. Accordingly, as illustrated in FIG. 1, the cathode active material layer 110 may include a plurality of crystal grains 111 and crystal grain boundaries between the crystal grains 111. Since the cathode active material layer 110 include or is formed of sintered ceramics, the cathode active material layer 110 may have a higher cathode active material density or volume fraction than that of a conventional cathode active material formed by mixing cathode active material particles, a conductive material, and a binder. Accordingly, such an embodiment of a secondary battery using the cathode active material layer 110 may have an improved battery capacity density.

In an exemplary embodiment of the cathode active material layer 110, the crystal grains 111 in the cathode active material layer 110 may be regularly aligned in a direction in which the movement of electrons is facilitated. In such an embodiment, a crystal direction of the crystal grains 111 may not be randomly and irregularly oriented, but may be regularly oriented in a predetermined direction in which the movement of electrons is facilitated.

Figure 2:
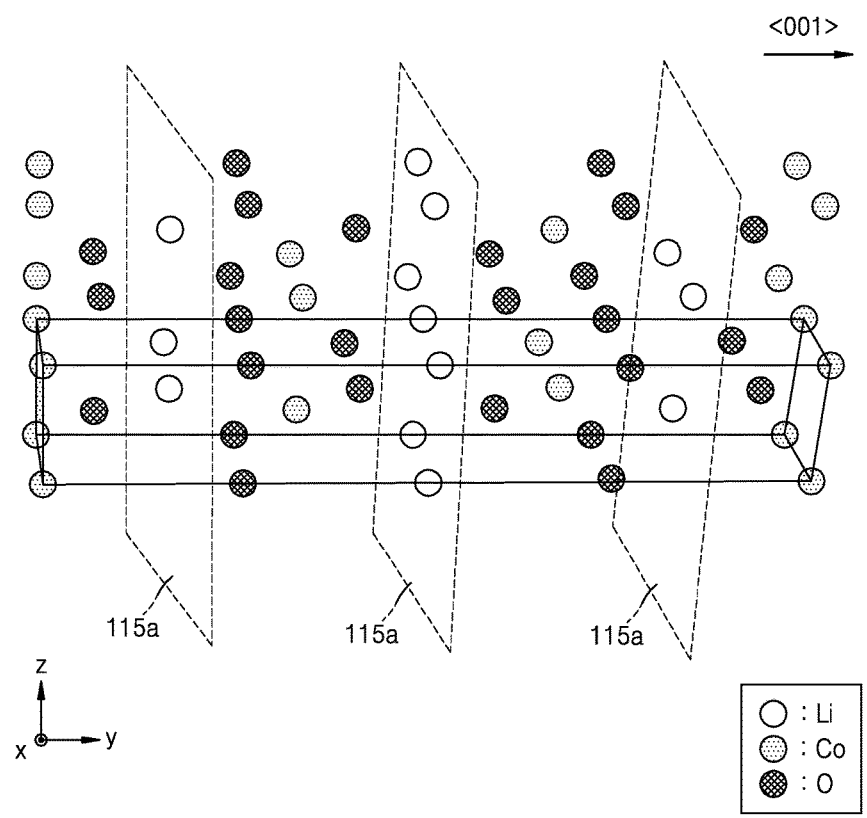
FIG. 2 illustrates a structure and direction of lithium-based oxide crystals in an exemplary embodiment of a cathode active material layer.

FIG. 2 illustrates a structure and direction of lithium-based oxide crystals in an exemplary embodiment of the cathode active material layer 110. In FIG. 2, the lithium-based oxide crystal is a $LiCoO_2$ crystal. As schematically illustrated in FIG. 2, the lithium-based oxide crystal has a crystal structure of a layered structure, in which lithium elements form one layer and oxygen and cobalt elements form respective layers, such that the crystal structure includes a lithium layer, an oxygen layer and a cobalt layer, which are alternately arranged one on another. In the crystal structure of the lithium-based oxide crystal, a lithium plane 115a defined by lithium elements that are arranged in a layer is disposed in a direction parallel to a {001} crystal plane of the lithium-based oxide crystal, that is, in a direction perpendicular to a <001> crystal direction. In general, in the layered structure of lithium-based oxide crystals, the movement of electrons in the <001> crystal direction is known to be about 500 times difficult than the movement of electrons in the direction perpendicular to the <001> crystal direction. In other words, the electrons may be easily moved in the direction parallel to the lithium plane 115a. Accordingly, in the layered structure of lithium-based oxide crystals, the electrons are to move more effectively in the direction perpendicular to the <001> crystal direction.

In consideration of the electrical characteristics of the lithium-based oxide crystal, according to an exemplary embodiment, the crystal grains 111 may be oriented in a way such that a c-axis of the lithium-based oxide crystal, that is, the <001> crystal direction, is parallel to a surface, that is, an x-y plane, of the cathode collector layer 101. In one exemplary embodiment, for example, as illustrated in FIG. 1, the crystal grains 111 may be oriented in a way such that the lithium plane 115a defined by lithium elements disposed in layers in each of the crystal grains 111 is perpendicular to the surface of the cathode collector layer 101. Accordingly, the lithium planes 115a in the crystal grains 111 may be aligned to be parallel to a z-axis direction. According to an exemplary embodiment, since the crystal grains 111 of the lithium-based oxide crystal are regularly oriented in a direction in which the movement of electrons is facilitated, electrical conductivity between the cathode active material layer 110 and the cathode collector layer 101 may be improved. In such an embodiment, capacity and rate capability of a secondary battery using the cathode active material layer 110 may be improved. If the crystal direction of the crystal grains 111 is irregularly oriented, an electrical path from the cathode active material layer 110 to the cathode collector layer 101 is in a zigzag shape and thus electric resistance increases further. In an exemplary embodiment, as described above, since the crystal grains 111 are regularly oriented, the length of the electrical path from the cathode active material layer 110 to the cathode collector layer 101 decreases and thus electrical conductivity may be further improved.

To regularly orient the crystal direction of the crystal grains 111, a seed template 112 that is a single crystal and has a shape of a plate may be used when the cathode active material is sintered. Accordingly, as illustrated in FIG. 1, each of the crystal grains 111 may include the seed template 112 having a shape of a plate and a matrix crystal 115 surrounding the seed template 112. In an exemplary embodiment of a process of forming the cathode active material layer 110, the seed template 112 having a shape of a plate is arranged in a predetermined direction in the cathode active material, and the matrix crystal 115 is grown from the seed template 112. Accordingly, the crystal grains 111 may be oriented in a predetermined direction.

FIGS. 3A to 3D illustrate an exemplary embodiment of a method of manufacturing the cathode 100 of FIG. 1. Hereinafter, an exemplary embodiment of a method of manufacturing the cathode 100 will be described with reference to FIGS. 3A to 3D.

Figure 3A:
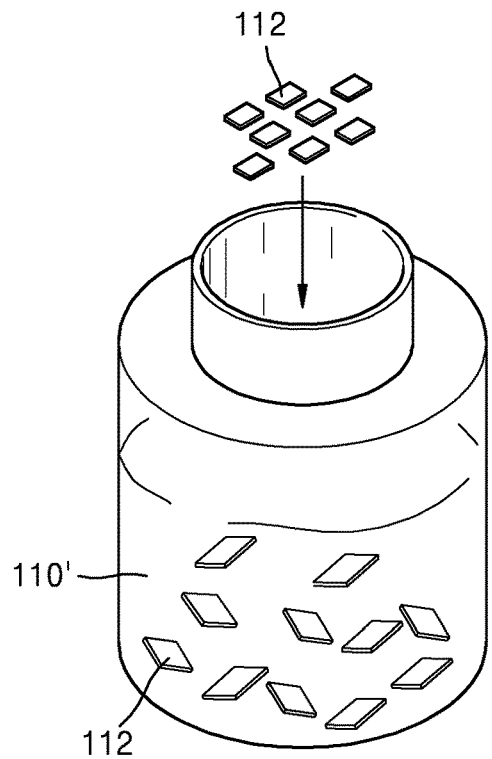
FIGS. 3A to 3D illustrate an exemplary embodiment of a method of manufacturing the cathode of a secondary battery of FIG. 1.

First, referring to FIG. 3A, an active material slurry 110' is prepared by mixing cathode active material powder including a lithium-based oxide and binder powder in a solvent. In one exemplary embodiment, for example, the binder powder may include a poly-vinyl butyral ("PVB") based material. In such an embodiment, toluene, ethanol or acetone may be used as the solvent. In such an embodiment, the cathode active material powder and the binder powder may be mixed in the solvent using a ball milling process. The seed templates 112 in the form of powder are added to the active material slurry 110' prepared as described above, and the seed templates 112 and the active material slurry 110' are additionally mixed with each other. The seed template 112 may have a shape having a thin thickness such that a thickness of the seed template 112 may be substantially less than a width and a length thereof. The quantity of the seed template 112 to be added may be adjusted according to the quantity of the active material slurry 110'.

Figure 3B:
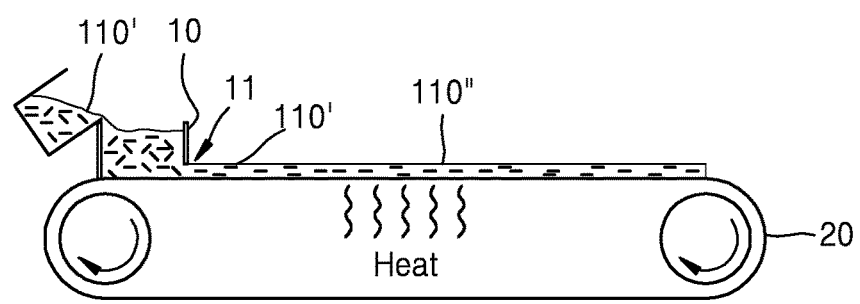

Referring to FIG. 3B, the active material slurry 110' mixed with the seed template 112 may be casted in the form of a thick film tape through a tape casting process. In one exemplary embodiment, for example, after the active material slurry 110' is poured in a dam 10 with an opening 11 having a wide width and a low height, the active material slurry 110' may be discharged through the opening 11 of the dam 10 over a carrier film 20. Then, the active material slurry 110' may be coated in the form of a thick film tape on the carrier film 20. In one exemplary embodiment, for example, the active material slurry 110' in the form of a thick film tape formed on the carrier film 20 may have a thickness of about several tens of micrometers, but not being limited thereto. The thickness of the active material slurry 110' may be adjusted by adjusting the height of the opening 11 of the dam 10 or by controlling viscosity of the active material slurry 110'.

The seed templates 112 having a shape of a plate and a large aspect ratio that are mixed in the active material slurry 110' may be naturally aligned in a direction in which the active material slurry 110' is discharged, by a shear force acting on the opening 11 of the dam 10. In such an embodiment, the opening 11 of the dam 10 may be set to be sufficiently narrow and an aspect ratio of the opening 11 of the dam 10 is set to be high, to have a sufficient shear force act on the seed templates 112 distributed in the active material slurry 110' during the discharge of the active material slurry 110'. In such an embodiment, it is desired that the aspect ratio of the seed template 112 is sufficiently high. In consideration of the direction in which the seed templates 112 are aligned, the height of the opening 11 of the dam 10 is very low and the width of the opening 11 may be greater than the height thereof. In one exemplary embodiment, for example, the height of the opening 11 of the dam 10 may be several tens of micrometers.

In the process of FIG. 3B, when the active material slurry 110' is coated on the carrier film 20, the active material slurry 110' coated on the carrier film 20 is heated to remove the solvent, thereby obtaining an active material tape 110" in the form of a thick film tape. The seed templates 112 that are aligned to be roughly parallel to a surface of the active material tape 110" are included in the active material tape 110" that is dried.

After forming the active material tape 110" by drying the active material slurry 110', the active material tape 110" may be cut into a predetermined size. Then, referring to FIG. 3C, the cathode collector layer 101 may be printed on a surface of the active material tape 110" that is cut into the predetermined size. In one exemplary embodiment, for example, a metal film is formed on the surface of the active material tape 110" using a method such as sputtering or evaporation, and thus the cathode collector layer 101 may be provided, e.g., printed, thereon. Alternatively, a metal paste including metal powder may be coated on the surface of the active material tape 110". In such an embodiment, the binder in the metal paste is removed in a subsequent binder burn-out process, and the metal powder is sintered in a subsequent sintering process, thereby forming the cathode collector layer 101.

Figure 3C:
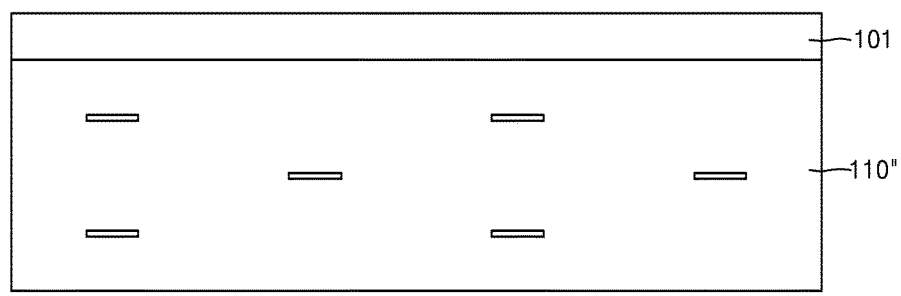
Figure 3D:
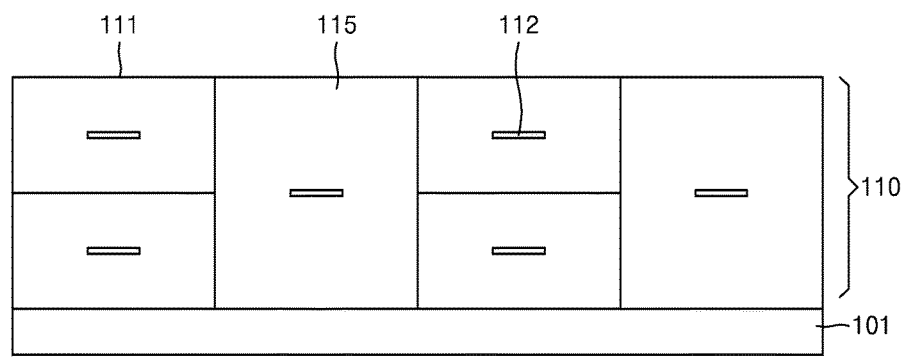

Finally, referring to FIG. 3D, the binder burn-out and sintering processes may be performed in a furnace. In the binder burn-out process, the binder in the active material tape 110" is removed and thus only the cathode active material powder and the seed templates 112 that are aligned remains. In the sintering process, the cathode active material powder around, e.g., surrounding, the seed template 112 grows as crystals along crystal planes of the seed templates 112. A sintering temperature may be, for example, about 1000° C. to about 1050° C., but not being limited thereto. When the sintering is completed, the cathode active material layer 110 having the crystal grains 111 that are aligned in the same crystal direction may be formed. In FIG. 3C, when the metal paste is coated on the surface of the active material tape 110", the cathode collector layer 101 may be formed simultaneously with the forming of the cathode active material layer 110.

Although FIG. 3D illustrates that the seed templates 112 are distinguished form the matrix crystals 115 after sintering, a boundary between the seed template 112 and the matrix crystal 115 may not be seen or may not exist in some of the crystal grains 111. Although in FIG. 3D the crystal grains 111 are schematically shown as rectangles for convenience of illustration, the crystal grains 111 may actually have very diverse shapes. In such an embodiment, the crystal grain boundaries may have a curved, not linear, shape or other irregular shapes.

In an exemplary embodiment, a secondary battery may include the cathode 100 having the cathode collector layer 101 and the cathode active material layer 110 which are formed as described above.

The thickness of the cathode active material layer 110 formed in the above-described method may be, for example, equal to or less than about 100 micrometers (μm). The thickness of the cathode active material layer 110 may be controlled by the thickness of the active material tape 110" in the form of a thick film tape in FIG. 3B. In such an embodiment, the number of the crystal grains 111 in the cathode active material layer 110 may be adjusted by the number of the seed templates 112 added to the active material slurry 110' in FIG. 3A. In such an embodiment, the thickness of the cathode active material layer 110 and the number of the crystal grains 111 may be adjusted by stacking and sintering the active material tapes 110".

An average size of the crystal grains 111 may be controlled according to the thickness of the cathode active material layer 110 and the number of the crystal grains 111. In general, the electrical resistance of a sintered cathode active material sharply increases at the crystal grain boundary rather than in the crystal grain. Accordingly, as the number of crystal grain boundaries increases in the sintered cathode active material, electrical conductivity decreases. According to embodiments of the method illustrated in FIGS. 3A to 3D, since the average size of the crystal grains 111 may be increased by controlling the thickness of the cathode active material layer 110 and the number of the crystal grains 111, the number or density of the crystal grain boundaries in the cathode active material layer 110 may be reduced. In one exemplary embodiment, for example, the average grain size of the crystal grains 111 may be equal to or greater than about 5 μm. Accordingly, the electrical conductivity of the cathode active material layer 110 may be further improved.

As described above, in the tape casting process of FIG. 3B, the seed templates 112 may be aligned in a predetermined direction, and the crystal direction of the crystal grains 111 grown in the sintering process of FIG. 3D may be determined according to the alignment direction of the seed templates 112. When the compositions of the seed template 112 and the matrix crystal 115 are identical to each other, for example, when the seed template 112 is a lithium-oxide single crystal, the crystal direction of the crystal grains 111 may be oriented in the same direction as the crystal direction of the seed template 112. However, the composition of the seed template 112 may not be necessarily the same as that of the matrix crystal 115. Any material may be used for the seed template 112 if the cathode active material powder around the seed template 112 may have crystal growth from the seed template 112 to the matrix crystal 115 in the sintering process of FIG. 3D. When the composition of the seed template 112 is different from that of the matrix crystal 115, the crystal direction of the crystal grains 111 may be the same as or different from the crystal direction of the seed template 112 according to the crystal structure of the seed template 112. When the crystal direction of the crystal grains 111 is different from the crystal direction of the seed template 112, the crystal direction of the seed template 112 may be selected such that the crystal grains 111 that are finally formed are oriented in a direction in which the movement of electrons the crystal grains 111 is facilitated.

Figure 4:
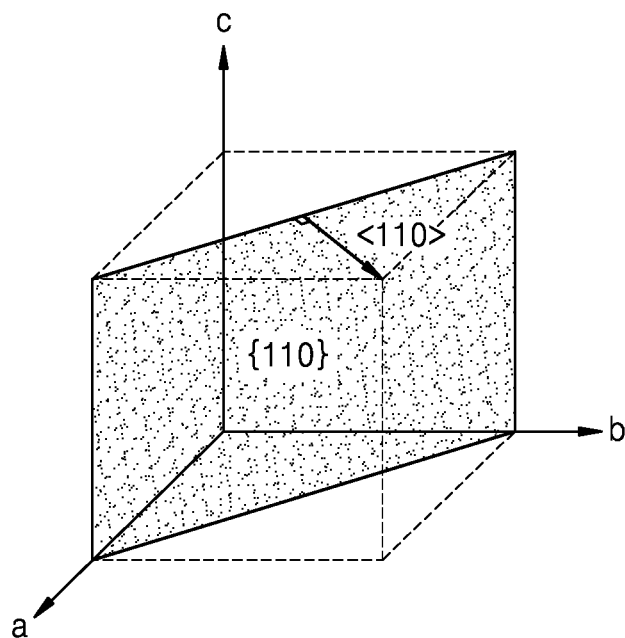
FIG. 4 is a graph showing a crystal direction and a crystal plane of a lithium-based oxide crystal.
Figure 5:
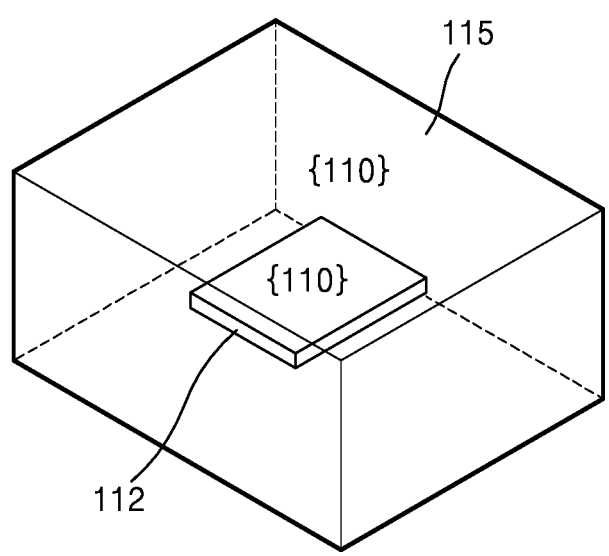
FIG. 5 is a schematic diagram illustrating an arrangement of a crystal plane of a crystal grain and a seed template in an exemplary embodiment of a cathode active material layer.

FIG. 4 is a graph showing a crystal direction and a crystal plane of a lithium-based oxide crystal. FIG. 5 is a schematic diagram illustrating an arrangement of crystal planes of the crystal grains 111 and the seed template 112 in the cathode active material layer 110. Referring to FIG. 4, a c-axis direction of a lithium-based oxide crystal is a <001> crystal direction and a crystal plane {110} is parallel to the <001> crystal direction. As described above, in the lithium-based oxide crystal, the lithium plane 115a is arrayed in a direction parallel to the {001} crystal plane of the lithium-based oxide crystal, that is, in a direction perpendicular to the <001> crystal direction. Since electrons are easily moved in a direction parallel to the lithium plane 115a, in order to have the crystal grains 111 oriented in a direction in which the movement of electrons is facilitated, the crystal grains 111 may be oriented such that a crystal plane perpendicular to the {001} crystal plane is parallel to the surface of the cathode collector layer 101, e.g., the <001> crystal direction or the {110} crystal plane of the crystal grain 111. For convenience of description, although the {110} crystal plane is described as an example, the crystal plane perpendicular to the {001} crystal plane is not limited to the {110} crystal plane. Although FIG. 5 illustrates that both of the crystal planes of the seed template 112 and the matrix crystal 115 are identical to the {110} crystal plane, when the composition of the seed template 112 and the composition of the matrix crystal 115 are different from each other, the crystal plane of the seed template 112 may differ from the {110} crystal plane. In one exemplary embodiment, for example, the crystal direction of the seed template 112 may be selected such the {110} crystal plane of the crystal grains 111 having crystal growth from the seed template 112 is parallel to the surface of the cathode collector layer 101.

All the <001> crystal directions of the crystal grains 111 in the cathode active material layer 110 may not be oriented in the same direction. In one exemplary embodiment, for example, the <001> crystal directions of the crystal grains 111 may be rotated in different directions if the <001> crystal directions are parallel to the surface of the cathode collector layer 101. In an exemplary embodiment, where another certain crystal direction in which the electron movement is somewhat facilitated exists, the <001> crystal direction may not be parallel to the surface of the cathode collector layer 101. In such an embodiment, when over a certain degree of electron mobility is satisfied, the lithium plane 115a may be disposed inclined with respect to the surface of the cathode collector layer 101, not being completely perpendicular thereto. In one exemplary embodiment, for example, the crystal grains 111 may be oriented such that at least one of crystal directions <h00>, <0k0>, <hk0>, <101>, <012>, <104>, <113>, <021>, and <024>, where "h" and "k" are integers equal to or greater than 1, is perpendicular to the surface of the cathode collector layer 101.

Figure 6:
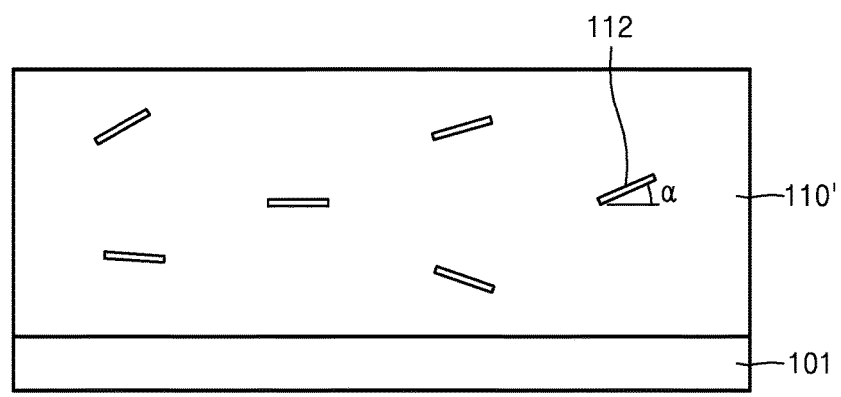
FIG. 6 is a cross-sectional view exemplarily illustrating a state in which seed templates are aligned in an active material slurry.

Although in the tape casting process of FIG. 3B the seed templates 112 are all aligned in a certain direction, all of the seed templates 112 may not be disposed completely parallel to the surface of the cathode collector layer 101. In one exemplary embodiment, for example, FIG. 6 is a cross-sectional view exemplarily illustrating a state in which the seed templates 112 are aligned in the active material slurry 110'. As illustrated in FIG. 6, some of the seed templates 112 may be disposed inclined with respect to the surface of the cathode collector layer 101. In such an embodiment, the seed templates 112 may be averagely disposed parallel to the surface of the cathode collector layer 101. In one exemplary embodiment, for example, an acute angle a between the surface of each of the seed templates 112 and the surface of the cathode collector layer 101 may be in a range of about ±45°, that is, in a range of about −45° to about +45°. A surface of the seed template 112 may indicate a largest surface, facing the surface of the cathode collector layer 101, of the surfaces of the seed template 112 having a shape of a plate. In one exemplary embodiment, for example, a side surface of the seed template 112 having a shape of a plate has a relatively smaller area, and each of front and rear (or upper and lower) surfaces of the seed template 112 has a relatively large area compared to the side surface. Of the front and rear surfaces of the seed template 112, a surface facing the surface of the cathode collector layer 101 may be a reference surface with which the acute angle a is defined.

Figure 7:
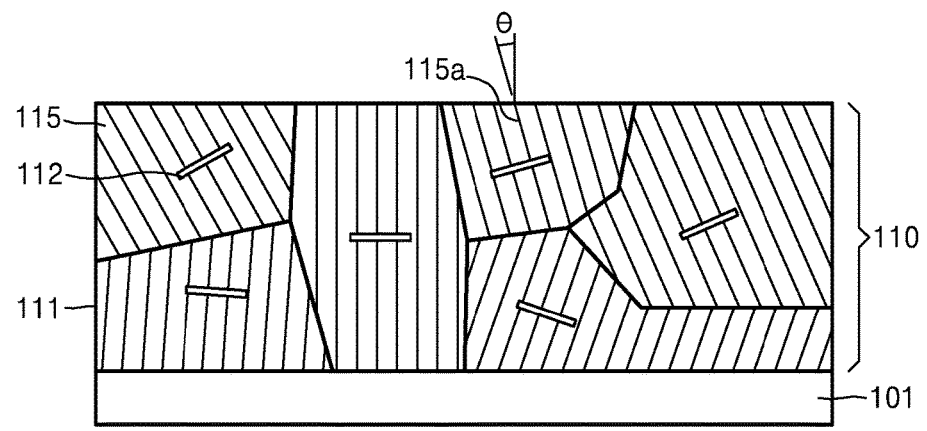
FIG. 7 is a cross-sectional view exemplarily illustrating a structure and orientation of crystal grains grown from the seed templates of FIG. 6.

In such an embodiment, due to an alignment error of the seed templates 112, crystal orientations of the crystal grains 111 may have slight errors. FIG. 7 is a cross-sectional view exemplarily illustrating a structure and orientation of the crystal grains 111 grown from the seed templates 112 of FIG. 6. In an exemplary embodiment, as illustrated in FIG. 7, not all of the lithium planes 115a in the crystal grains 111 may be oriented to be completely perpendicular to the surface of the cathode collector layer 101. In such an embodiment, the lithium planes 115a may be averagely oriented to be roughly perpendicular to the surface of the cathode collector layer 101. In one exemplary embodiment, for example, the crystal grains 111 may be oriented such that the acute angle θ between a direction perpendicular to the surface of the cathode collector layer 101 and the lithium plane 115a defined by lithium elements arranged in layers in each of the crystal grains 111 is within about ±45°. In such an embodiment, some of the crystal grains 111 may be oriented such that the lithium plane 115a in each of the crystal grains 111 is perpendicular to the surface of the cathode collector layer 101.

Figure 8:
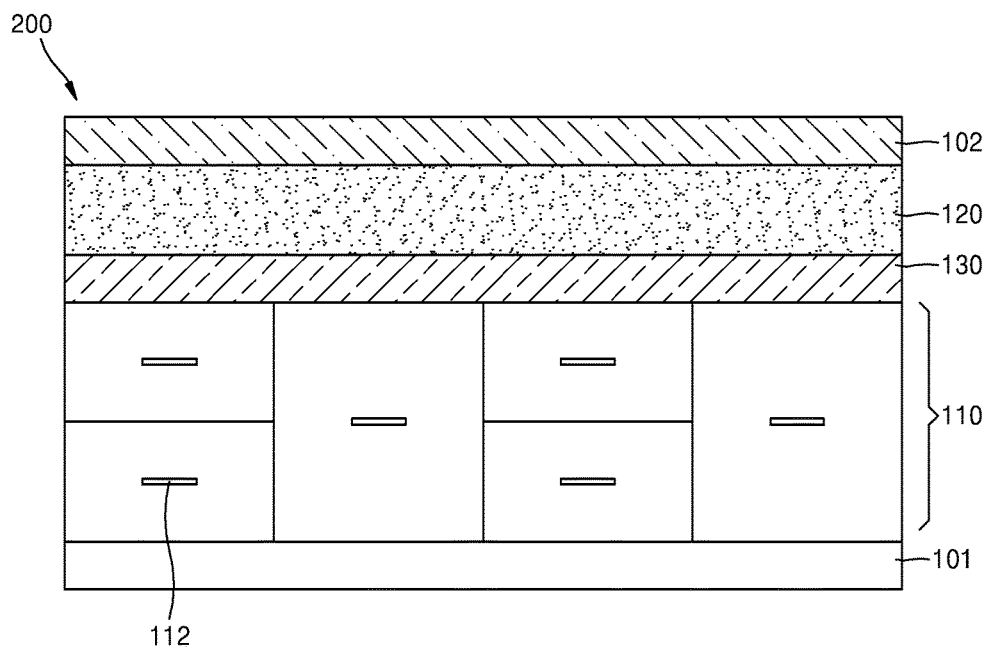
FIG. 8 is a schematic cross-sectional view of a structure of an exemplary embodiment of a secondary battery including the cathode shown in FIG. 1.

As described above, an exemplary embodiment of a secondary battery includes the cathode 100 configured as above, such that the capacity and rate capability of the secondary battery may be improved. FIG. 8 is a schematic cross-sectional view of an exemplary embodiment of a structure of a secondary battery 200 including the cathode 100 shown in FIG. 1. Referring to FIG. 8, an exemplary embodiment of the secondary battery 200 may include the cathode collector layer 101, the cathode active material layer 110 disposed on the surface of the cathode collector layer 101, an anode collector layer 102, an anode active material layer 120 disposed on a surface of the anode collector layer 102, and an electrolyte layer 130 interposed between the cathode active material layer 110 and the anode active material layer 120. In such an embodiment the secondary battery 200 of FIG. 8, the cathode active material layer 110 may be the same as an exemplary embodiment of the cathode active material layer described above with reference to FIGS. 1 to 7.

The electrolyte layer 130 may include a solid electrolyte such as $Li_3PO_4$, $Li_3PO_{4-x}N_x$, $LiBO_{2-x}N_x$, $Li_3PO_4N_x$, $LiBO_2Nx$, $Li_4SiO_4$-$Li_3PO_4$, or $Li_4SiO_4$-$Li_3VO_4$. In an exemplary embodiment, where the secondary battery 200 uses a liquid electrolyte, a separation film, instead of the electrolyte layer 130, may be disposed between the cathode active material layer 110 and the anode active material layer 120.

IN such an embodiment, the anode active material layer 120 may include or be formed of a material, for example, lithium (Li) metal, graphite, silicon (Si), or a Si alloy.

Figure 9:
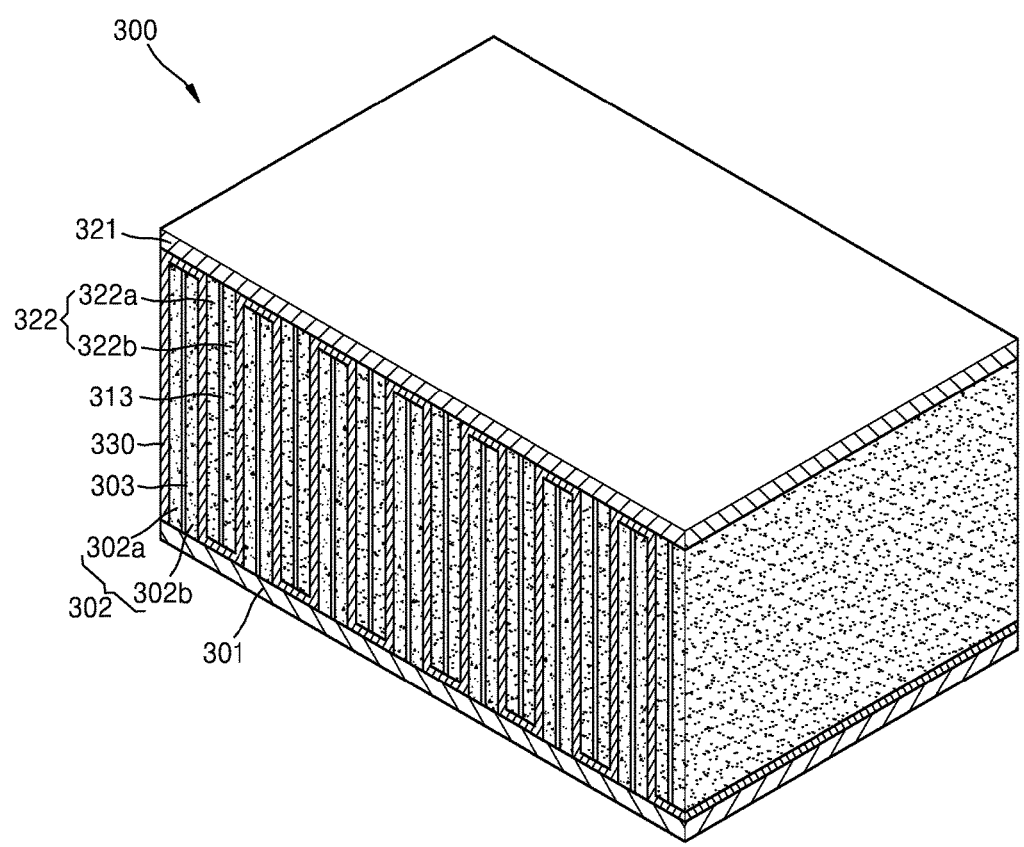
FIG. 9 is a schematic perspective view of a structure of a secondary battery according to an alternative exemplary embodiment.

FIG. 9 is a schematic perspective view of a structure of a secondary battery 300 according to an alternative exemplary embodiment. Referring to FIG. 9, an exemplary embodiment of the secondary battery 300 may include a cathode collector layer 301 and an anode collector layer 321 disposed opposite to the cathode collector layer 301, a plurality of cathode active material layers 302 electrically contacting the cathode collector layer 301, a plurality of anode active material layers 322 electrically contacting the anode collector layer 321, and an electrolyte layer 330 interposed between the cathode active material layers 302 and the anode active material layer 322, between the cathode active material layers 302 and the anode collector layer 321, and between the anode active material layer 322 and the cathode collector layer 301. In such an embodiment, the secondary battery 300 may further include a first conductive layer 303 electrically contacting the cathode collector layer 301 and disposed, e.g., inserted, in the cathode active material layers 302, and a second conductive layer 313 electrically contacting the anode collector layer 321 and disposed, e.g., inserted, in the anode active material layers 322.

The cathode collector layer 301 and the anode collector layer 321 may include or be formed of a conducive metal material, for example, Cu, Au, Pt, Ag, Zn, Al, Mg, Ti, Fe, Co, Ni, Ge, In, or Pd. The cathode active material layer 302 may electrically contact a surface of the cathode collector layer 301, and the anode active material layer 322 may electrically contact a surface of the anode collector layer 321. In one exemplary embodiment, for example, the cathode active material layer 302 and the anode active material layer 322 may be respectively disposed on, e.g., attached to, surfaces of the cathode collector layer 301 and the anode collector layer 321, facing each other. The cathode active material layers 302 and the anode active material layers 322 may be disposed substantially perpendicular to the cathode collector layer 301 and the anode collector layer 321, respectively. In one exemplary embodiment, for example, the cathode active material layer 302 may protrude from the surface of the cathode collector layer 301 to be substantially perpendicular thereto, and the anode active material layer 322 may protrude from the surface of the anode collector layer 321 to be roughly perpendicular thereto. In such an embodiment, the cathode active material layers 302 and the anode active material layers 322 may be formed in a shape of a flat plate and may be disposed alternate with each other. In such an embodiment, the cathode active material layers 302 and the anode active material layers 322 may be disposed between the cathode collector layer 301 and the anode collector layer 321 to be respectively perpendicular to the cathode collector layer 301 and the anode collector layer 321, and also to be alternate in a direction parallel to the surfaces of the cathode collector layer 301 and the anode collector layer 321.

In an exemplary embodiment, the electrolyte layer 330 may be disposed in a way such that the cathode active material layers 302 do not directly contact the anode active material layers 322 and the anode collector layer 321. In such an embodiment, the electrolyte layer 330 may be disposed in a way such that the anode active material layers 322 do not directly contact the cathode active material layers 302 and the cathode collector layer 301. In one exemplary embodiment, for example, the electrolyte layer 330 may have a zigzag shape between the cathode active material layers 302 and the anode active material layers 322, between the cathode active material layers 302 and the anode collector layer 321, and between the anode active material layers 322 and the cathode collector layer 301. Accordingly, the cathode active material layer 302 and the anode active material layer 322 may exchange metal ions through the electrolyte layer 330, without directly contacting each other. In an exemplary embodiment, the cathode collector layer 301 may be electrically connected to only the cathode active material layer 302, and the anode collector layer 321 may be electrically connected to only the anode active material layer 322. According to an exemplary embodiment, the electrolyte layer 330 may include or be formed of a solid electrolyte that is fixed in a zigzag shape.

For a uniform ion exchange reaction between the cathode active material layer 302 and the anode active material layer 322, the first conductive layer 303 and the second conductive layer 313 may be disposed, e.g., inserted, in the cathode active material layer 302 and the anode active material layer 322, respectively. In an exemplary embodiment, the first conductive layer 303 may be electrically connected to the cathode collector layer 301 and may be disposed, e.g., inserted, in the cathode active material layer 302. In such an embodiment, the second conductive layer 313 may be electrically connected to the anode collector layer 321 and may be inserted in the anode active material layer 322. In one exemplary embodiment, for example, the first conductive layer 303 may extend perpendicularly from the surface of the cathode collector layer 301, and the second conductive layer 313 may extend perpendicular from the surface of the anode collector layer 321. The cathode active material layer 302 may be divided by the first conductive layer 303 into two parts 302a and 302b, and the anode active material layer 322 may be divided by the second conductive layer 313 into two parts 322a and 322b. Since the first and second conductive layers 303 and 313 are respectively disposed in the cathode and anode active material layers 302 and 322, electrons may be easily supplied from ends of the cathode and anode active material layers 302 and 322 adjacent to the electrolyte layer 330 toward the cathode and anode collector layers 301 and 321, respectively.

According to an exemplary embodiment, where the cathode and anode active material layers 302 and 322 that are independently parallel to each other are alternately disposed between the cathode and anode collector layers 301 and 321, which are parallel to each other, to be respectively perpendicular to the surfaces of the cathode and anode collector layers 301 and 321, both of energy density and rate capability of the secondary battery 300 may be improved. In an exemplary embodiment, when the height of a unit cell of the secondary battery 300 is increased by increasing the heights of the cathode and anode active material layers 302 and 322, a reaction area increases according to the height and thus the rate capability may be improved. In such an embodiment, when the height of a unit cell of the secondary battery 300 is increased, fractions taken by the cathode and anode active material layers 302 and 322 in the secondary battery 300 increase and thus the energy density of the secondary battery 300 may be improved.

Figure 10:
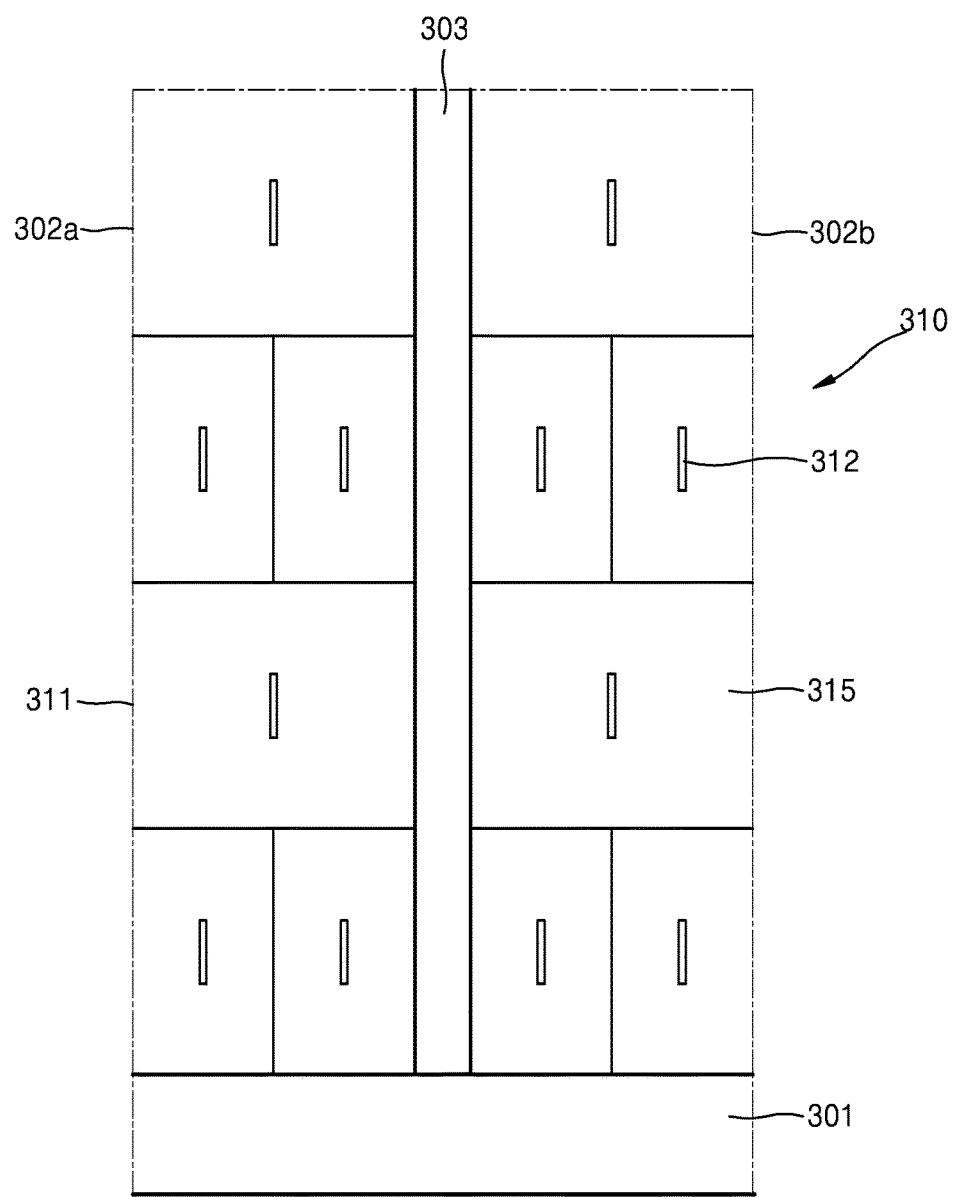
FIG. 10 is a schematic cross-sectional view of a partial structure of an exemplary embodiment of a cathode part of the secondary battery of FIG. 9.

FIG. 10 is a schematic cross-sectional view of a partial structure of an exemplary embodiment of a cathode part of the secondary battery 300 of FIG. 9. Referring to FIG. 10, in an exemplary embodiment, the cathode active material layers 302a and 302b may include or be formed of sintered polycrystalline ceramics obtained by sintering a cathode active material. In one exemplary embodiment, for example, the cathode active material layers 302a and 302b may be formed by sintering a material including a lithium-based oxide. In the cathode active material layers 302a and 302b, a plurality of crystal grains 311 may be regularly aligned in a direction in which the electron movement is facilitated. In one exemplary embodiment, for example, the crystal grains 311 may be oriented in way such that lithium planes defined by lithium elements disposed in layers in each of the crystal grains 311 may be perpendicular to a surface of the first conductive layer 303. In such an embodiment, seed templates 312 being a single crystal and having a shape of a plate may be aligned substantially parallel to the surface of the first conductive layer 303. Accordingly, such an embodiment of the cathode active material layer 302 of FIG. 9, an orientation of the crystal grains 311 and the seed templates 312 are determined based on the first conductive layer 303. In such an embodiment of the secondary battery 300 shown in FIG. 10, electrons may be easily moved in the cathode active material layer 302 in a direction perpendicular to the surface of the first conductive layer 303. In such an embodiment, the characteristics of the cathode active material layer 302 are the same as those of the cathode active material layer 110 of FIG. 1, except that the orientation of the crystal grains 311 and the seed templates 312 is determined based on the first conductive layer 303. In one exemplary embodiment, for example, the crystal grains 111 may be oriented such that at least one of crystal directions <h00>, <0k0>, <hk0>, <101>, <012>, <104>, <113>, <021>, and <024>, where "h" and "k" are integers equal to or greater than 1, is perpendicular to the surface of the first conductive layer 303.

Although FIG. 10 illustrates that all the seed templates 312 are aligned in the same direction, actually, not all of the seed templates 312 may be oriented to be completely perpendicular to the surface of the first conductive layer 303. In one exemplary embodiment, for example, some of the seed templates 312 may be inclined with respect to the surface of the first conductive layer 303. However, averagely, the seed templates 312 are disposed substantially parallel to the surface of the first conductive layer 303. In one exemplary embodiment, for example, an acute angle a between the surface of each of the seed templates 312 and the surface of the first conductive layer 303 may be in a range of about ±45°. The surface of each of the seed templates 312 may indicate a relatively large one, facing the surface of the first conductive layer 303, of the surfaces of the seed templates 312 having a shape of a plate. In one exemplary embodiment, for example, of relatively large front and rear surfaces of the seed templates 312, a surface facing the surface of the first conductive layer 303 may be the surface forming the acute angle a with the surface of the first conductive layer 303.

Figure 11:
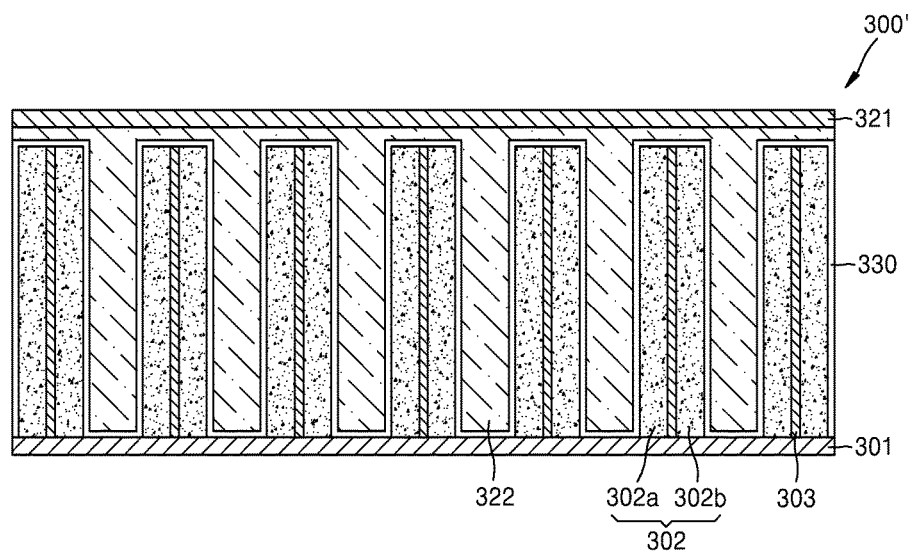
FIG. 11 is a schematic cross-sectional view of a structure of a secondary battery according to another alternative exemplary embodiment.

FIG. 11 is a schematic cross-sectional view of a structure of a secondary battery 300' according to another alternative exemplary embodiment. The secondary battery 300' of FIG. 11 is substantially the same as the secondary battery 300 of FIG. 9 except that the electrolyte layer 330 does not directly contact the anode collector layer 321. In an exemplary embodiment of the secondary battery 300 described above with reference to FIG. 9, the anode active material layers 322 are completely spaced apart from each other, such that the anode collector layer 321 is exposed between the anode active material layers 322. Accordingly, in such an embodiment, the electrolyte layer 330 contacts the anode collector layer 321 between the anode active material layers 322 that are adjacent to each other. In an exemplary embodiment of the secondary battery 300' shown in FIG. 11, end portions of the anode active material layers 322 are connected to each other and extend along the surface of the anode collector layer 321 to cover the anode collector layer 321. Accordingly, in such an embodiment, the electrolyte layer 330 does not contact the anode collector layer 321 between the anode active material layers 322 that are adjacent to each other. In such an embodiment, the electrolyte layer 330 contacts a surface formed as the end portions of the anode active material layers 322 are connected to each other along the surface of the anode collector layer 321.

In an exemplary embodiment of FIG. 11, the electrolyte layer 330 may be in a zigzag shape between the cathode active material layers 302 and the anode active material layers 322 and between the anode active material layers 322 and the cathode collector layer 301. Accordingly, in such an embodiment, a first surface of the electrolyte layer 330 may have a zigzag shape to contact the surfaces of the cathode active material layers 302 and the surface of the cathode collector layer 301. The anode active material layers 322 may be disposed to contact a second surface of the electrolyte layer 330 at the opposite side to the cathode collector layer 301.

Figure 12:
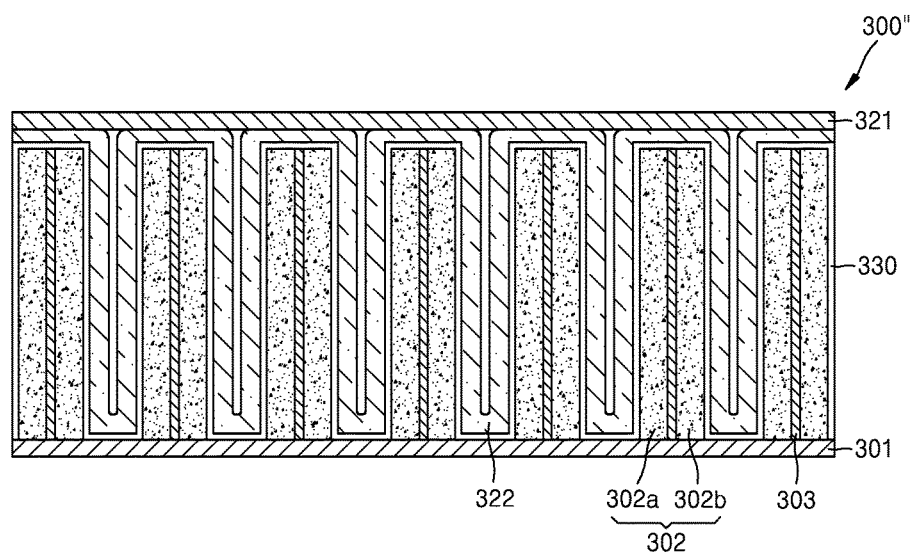
FIG. 12 is a schematic cross-sectional view of a structure of a secondary battery according to another alternative exemplary embodiment.

FIG. 12 is a schematic cross-sectional view of a structure of a secondary battery 300" according to another alternative exemplary embodiment. In FIG. 11, the anode active material layers 322 is disposed in , e.g., completely fills, a valley defined by the second surface of the electrolyte layer 330 that is formed in a zigzag shape. However, as illustrated in FIG. 12, similarly to the electrolyte layer 330, in another alternative exemplary embodiment, the anode active material layers 322 may be in a zigzag shape along the second surface of the electrolyte layer 330.

Alternatively, the structures of the cathode active material layers 302a and 302b of a cathode 310 described above with reference to FIG. 10 may be directly applied to the cathode active material layers 302a and 302b of the secondary batteries 300' and 300" of FIGS. 11 and 12. In one exemplary embodiment, for example, the cathode active material layers 302a and 302b of the secondary batteries 300' and 300" may include or be formed of sintered polycrystalline materials having the crystal grains 311. In an exemplary embodiment, the crystal grains 311 may be regularly aligned in a direction in which the electron movement is facilitated. In such an embodiment, the crystal grains 311 may be oriented in a way such that the lithium planes defined by lithium elements disposed in layers in each of the crystal grains 311 may be perpendicular to the surface of the first conductive layer 303. In such an embodiment, the seed templates 312 being a single crystal and having a shape of a plate in each of the crystal grains 311 may be aligned to be substantially parallel to the surface of the first conductive layer 303.

FIGS. 13 to 18 schematically illustrate an exemplary embodiment of a method of manufacturing the secondary battery 300' of FIG. 11.

Figure 13:
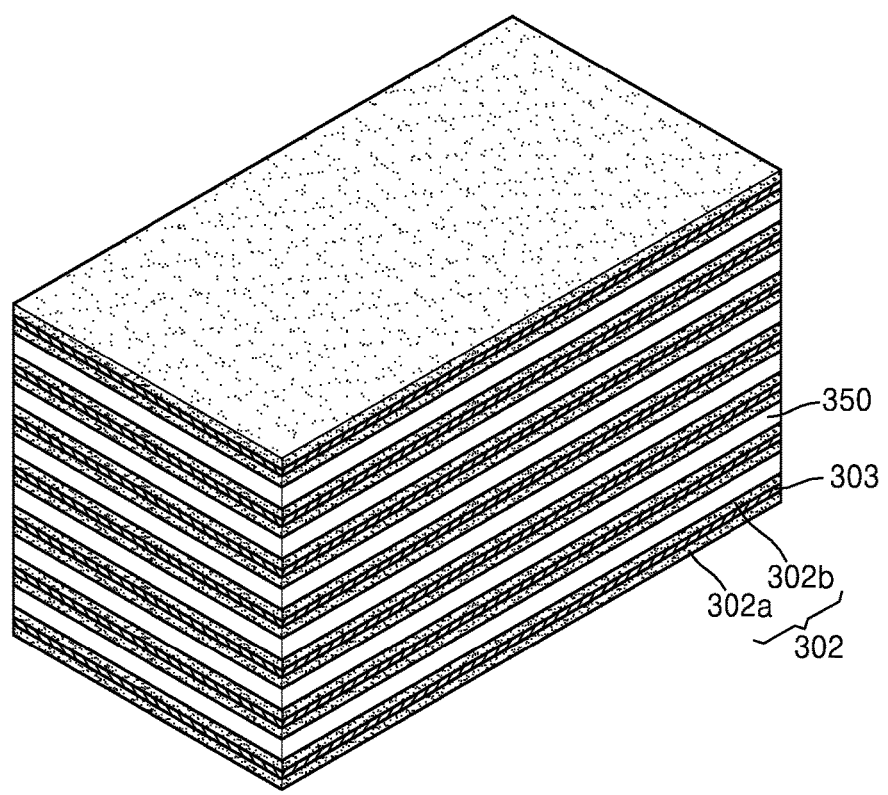
FIGS. 13 to 18 schematically illustrate an exemplary embodiment of a method of manufacturing the secondary battery of FIG. 11.

First, referring to FIG. 13, the active material tape in the form of a thick film tape, which are formed through the tape casting process described above with reference to FIGS. 3A and 3B, may be stacked on opposite surfaces of the first conductive layer 303. The seed templates 312 mixed in the active material tape may be aligned to be substantially parallel to the surface of the first conductive layer 303. The first conductive layers 303 having the active material tapes on both surfaces thereof may be alternately stacked with a plurality of sacrificial layers 350. Then, the active material tape may be sintered in the method described in FIG. 3D. Next, as illustrated in FIG. 13, the cathode active material layers 302 having the first conductive layer 303 arranged therein and the sacrificial layers 350 may be alternately disposed forming a layered structure. The thickness of the sacrificial layers 350 may be in a range of about 1 μm to about 50 μm, but not being limited thereto. The sacrificial layers 350 may be formed by manufacturing slurry including a sacrificial layer material, a dispersing agent, a solvent, a binder, a plasticizer, etc. in the form of a thick film tape. In one exemplary embodiment, for example, $Li_2CoSiO_4$ may be used as the sacrificial layer material, but not being limited thereto and other various materials may be used therefor.

Figure 14:
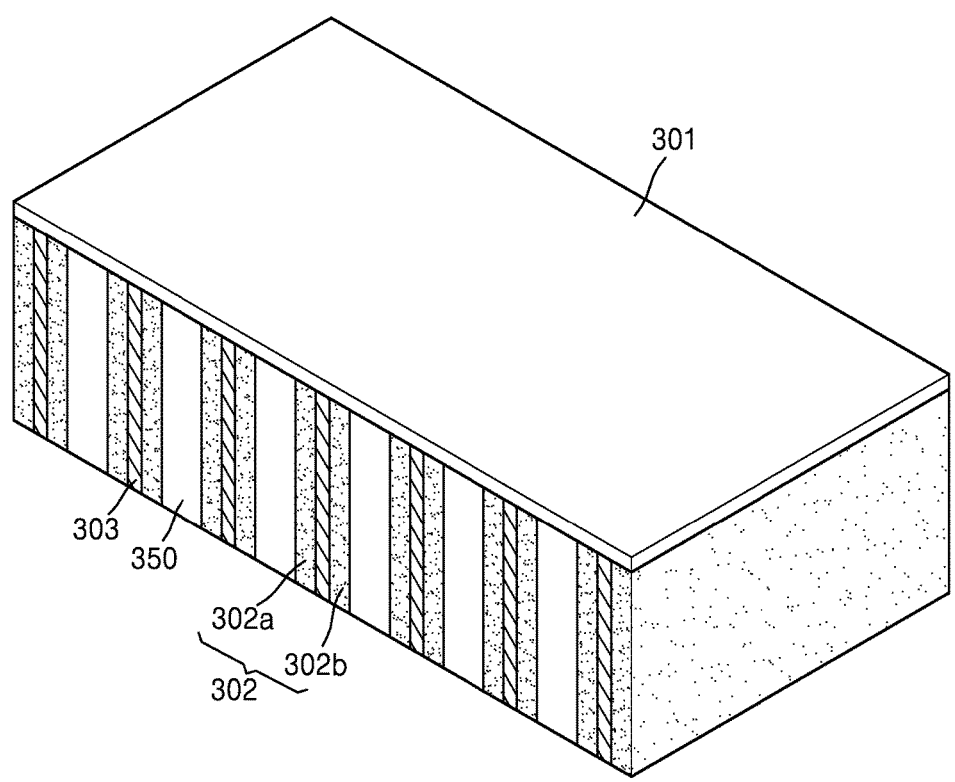

Next, referring to FIG. 14, the cathode collector layer 301 may be disposed on the layered structure formed in FIG. 13.

IN such an embodiment, as illustrated in FIG. 14, the cathode collector layer 301 may be disposed in a way such that the surface of the cathode collector layer 301 is perpendicular to the cathode active material layers 302. The layered structure may be cut by a predetermined size before the cathode collector layer 301 is disposed.

Alternatively, the sintering of the active material tape may be performed in the process of FIG. 14, not in the process of FIG. 13. In one exemplary embodiment, for example, after the cathode collector layer 301 is disposed in a direction perpendicular to the active material tape in the layered structure, in which the first conductive layers 303 having the active material tapes on the opposite surfaces thereof and the sacrificial layers 350 are alternately disposed, the cathode active material layer 302 may be formed through a sintering process. In such an embodiment, metal paste may be disposed instead of the first conductive layer 303 of FIG. 13 and the cathode collector layer 301 of FIG. 14. Then, the metal paste is sintered altogether in the sintering process so that the first conductive layer 303 and the cathode collector layer 301 may be formed simultaneously with the cathode active material layer 302.

Figure 15:
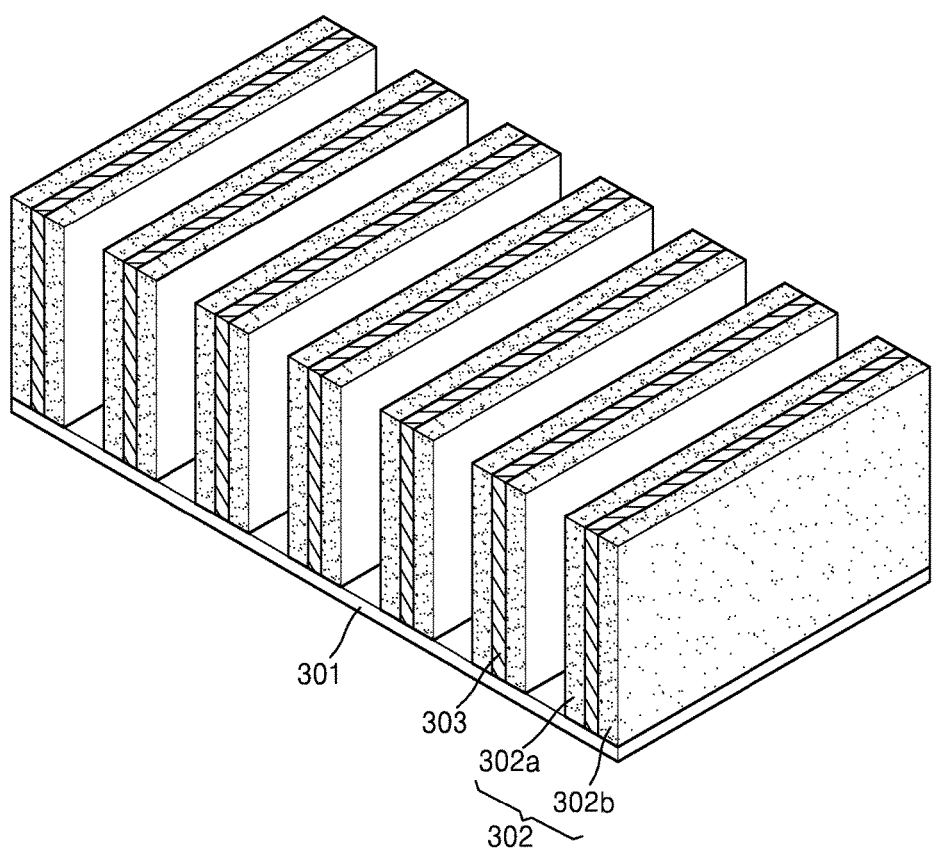

Then, as illustrated in FIG. 15, the sacrificial layers 350 between the cathode active material layers 302 may be removed. In one exemplary embodiment, for example, only the sacrificial layers 350 may be selectively etched using a dry etching or wet etching method. Hydrofluoric acid ("HF") may be used as an etchant, but not being limited thereto.

Figure 16:
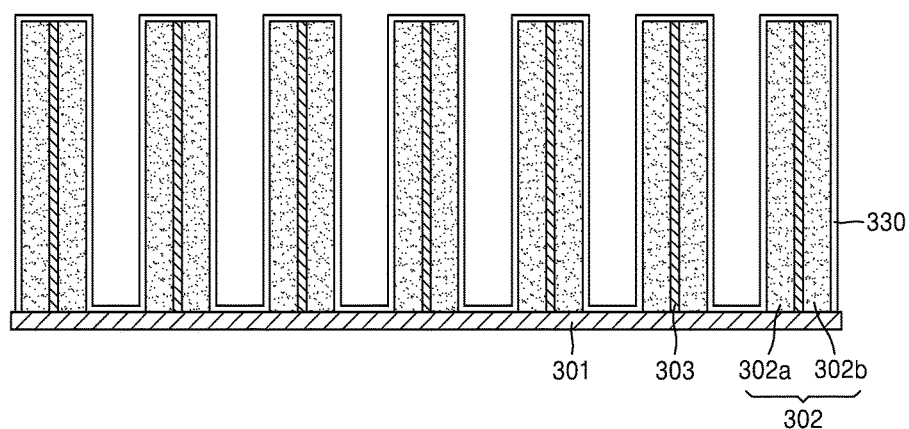

Referring to FIG. 16, the electrolyte layer 330 in a solid state may be formed to cover exposed surfaces of the cathode active material layer 302 and the cathode collector layer 301. The electrolyte layer 330 in a solid state may be deposited on the exposed surfaces of the cathode active material layer 302 and the cathode collector layer 301, by a method, for example, chemical vapor deposition ("CVD"), metal-organic CVD ("MOCVD"), plasma-enhanced CVD ("PECVD"), atomic layer deposition ("ALD"), or sputtering. In one exemplary embodiment, for example, the electrolyte layer 330 may include amorphous ceramic such as lithium phosphorus oxynitride ("LiPON"), but not being limited thereto.

Figure 17:
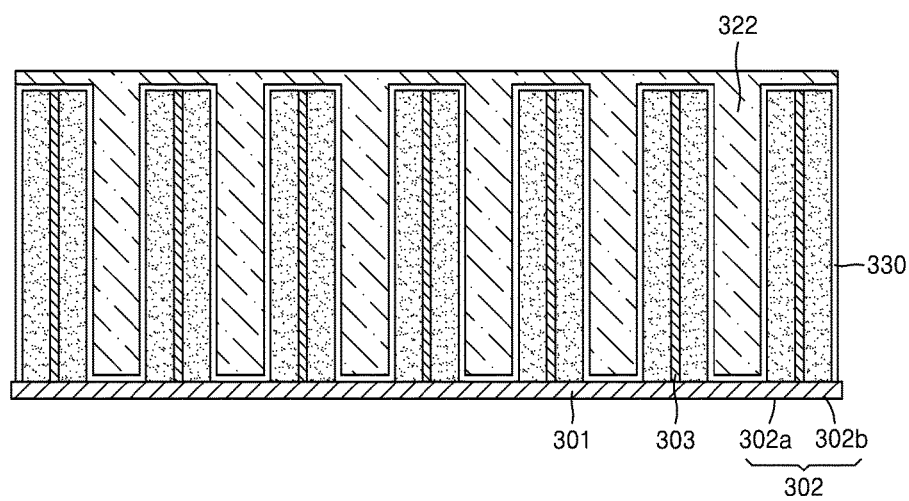

Referring to FIG. 17, the anode active material layer 322 may be provided or formed to cover the electrolyte layer 330. The anode active material layer 322 may fill an empty space between the cathode active material layers 302. Alternatively, as illustrated in FIG. 12, the anode active material layer 322 may be formed in a zigzag shape along the surface of the electrolyte layer 330 that is formed in a zigzag shape. A material for the anode active material layer 322 may include, for example, lithium metal, but not being limited thereto. The anode active material layer 322 may be formed by depositing lithium on the electrolyte layer 330 by, for example, evaporation, or by filling the space between the cathode active material layers 302 with molten lithium.

Figure 18:
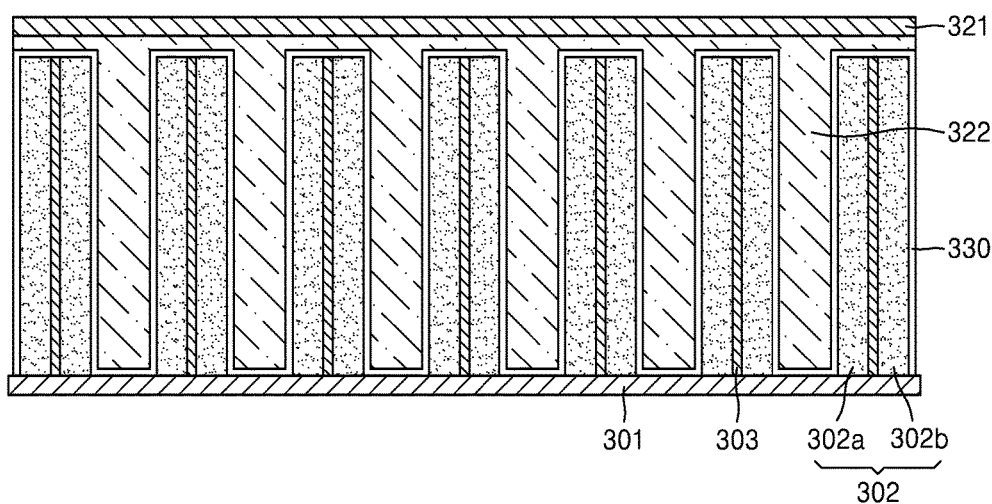

Finally, referring to FIG. 18, the anode collector layer 321 may be provided or formed on the anode active material layer 322. A material for the anode collector layer 321 may include, for example, copper (Cu), but not being limited thereto.

Herein, exemplary embodiments of a cathode having a sintered polycrystalline material, a secondary battery including the cathode and a method of manufacturing the cathode are described and illustrated in the accompanying drawings. However, It should be understood that exemplary embodiments described herein should be considered in a descriptive sense only and not for purposes of limitation. Descriptions of features or aspects within each exemplary embodiment should typically be considered as available for other similar features or aspects in other exemplary embodiments.

While one or more exemplary embodiments of the invention have been described with reference to the figures, it will be understood by those of ordinary skill in the art that various changes in form and details may be made therein without departing from the spirit and scope as defined by the following claims.

What is claimed is:

1. A cathode comprising:
a cathode collector layer; and
a cathode active material layer on a surface of the cathode collector layer,
wherein the cathode active material layer comprises a sintered polycrystalline material having a plurality of crystal grains of a lithium-based oxide, and
each of the plurality of crystal grains comprises:
a seed template; and
a matrix crystal around the seed template,
wherein the seed template is a single crystal and having a shape of a plate.

2. The cathode of claim 1, wherein a surface of the seed template having the shape of the plate, which faces a surface of the cathode collector layer, is substantially parallel to the surface of the cathode collector layer.

3. The cathode of claim 1, wherein an acute angle between a surface of the seed template having the shape of the plate, which faces a surface of the cathode collector layer, and a surface of the cathode collector layer is in a range of about ±45°.

4. The cathode of claim 1, wherein the seed template and the matrix crystal have different compositions from each other.

5. The cathode of claim 1, wherein the plurality of crystal grains are oriented in a way such that an acute angle between a direction perpendicular to a surface of the cathode collector layer and a direction of lithium planes defined by lithium elements in layers in each of the plurality of crystal grains is in a range of about ±45°.

6. The cathode of claim 1, wherein some of the plurality of crystal grains are oriented in a way such that a lithium plane defined by lithium elements in layers in each of the plurality of crystal grains is substantially perpendicular to a surface of the cathode collector layer.

7. The cathode of claim 1, wherein
a crystal direction of the plurality of crystal grains perpendicular to a surface of the cathode collector layer comprises at least one of directions <h00>, <0k0>, <hk0>, <101>, <012>, <104>, <113>, <021>, and <024>, wherein "h" and "k" are integers equal to or greater than 1.

8. The cathode of claim 1, wherein
the lithium-based oxide comprises $Li_xMO_2$,
wherein "M" is at least one of cobalt (Co), nickel (Ni), manganese (Mn), and
"x" is in a range of $0.2<x<1.2$.

9. The cathode of claim 1, wherein the cathode active material layer directly contacts the cathode collector layer.

10. A secondary battery comprising:
an anode collector layer;
an anode active material layer on a surface of the anode collector layer;
a cathode collector layer; and
a cathode active material layer on a surface of the cathode collector layer, wherein the cathode active material layer comprises a sintered polycrystalline material having a plurality of crystal grains of a lithium-based oxide, and
each of the plurality of crystal grains comprises:
  a seed template; and
  a matrix crystal around the seed template,
  wherein the seed template is a single crystal and having a shape of a plate.

\* \* \* \* \*